United States Patent [19]

Comstock et al.

[11] Patent Number: 4,754,317

[45] Date of Patent: Jun. 28, 1988

[54] INTEGRATED CIRCUIT DIE-TO-LEAD FRAME INTERCONNECTION ASSEMBLY AND METHOD

[75] Inventors: Robert L. Comstock; Steven L. Baburek, both of Santa Clara, Calif.

[73] Assignee: Monolithic Memories, Inc., Santa Clara, Calif.

[21] Appl. No.: 856,926

[22] Filed: Apr. 28, 1986

[51] Int. Cl.⁴ .................. H01L 23/48; H01L 23/04
[52] U.S. Cl. ........................................ 357/70; 357/74
[58] Field of Search .................. 357/70, 68, 80, 74

[56] References Cited

U.S. PATENT DOCUMENTS

| | | | |
|---|---|---|---|
| 4,079,511 | 3/1978 | Grabbe | 357/72 |
| 4,288,841 | 9/1981 | Gogal | 357/70 |
| 4,298,769 | 11/1981 | Richman | 357/70 |

FOREIGN PATENT DOCUMENTS

| | | |
|---|---|---|
| 2564244 | 11/1985 | France . |
| 56-100436 | 8/1981 | Japan . |
| 58-164255 | 9/1983 | Japan . |
| 58-210650 | 12/1983 | Japan . |
| 60-7160 | 1/1985 | Japan . |
| 61-10263 | 1/1986 | Japan . |

*Primary Examiner*—Andrew J. James
*Assistant Examiner*—S. V. Clark
*Attorney, Agent, or Firm*—Thomas S. MacDonald; Alan H. MacPherson; Paul J. Winters

[57] ABSTRACT

In order to prevent bonding wire sag and to allow high lead count an insulative bridging member is provided between the ends of inner leads of a lead frame and a centrally mounted integrated circuit die. The bridging member of annular square configuration has transverse plated spaced conductive pathways. A first series of short bonding wires connect selected die contact pads to an inner end of selected conductive pathways and a second concentric series of bonding wires connect an outer end of the selective conductive pathways of the bridging member to selected ones of the inner leads of the lead frame. The above elements except for outer leads of the lead frame are encapsulated to form an overall die package with external leads or pin contacts.

8 Claims, 1 Drawing Sheet

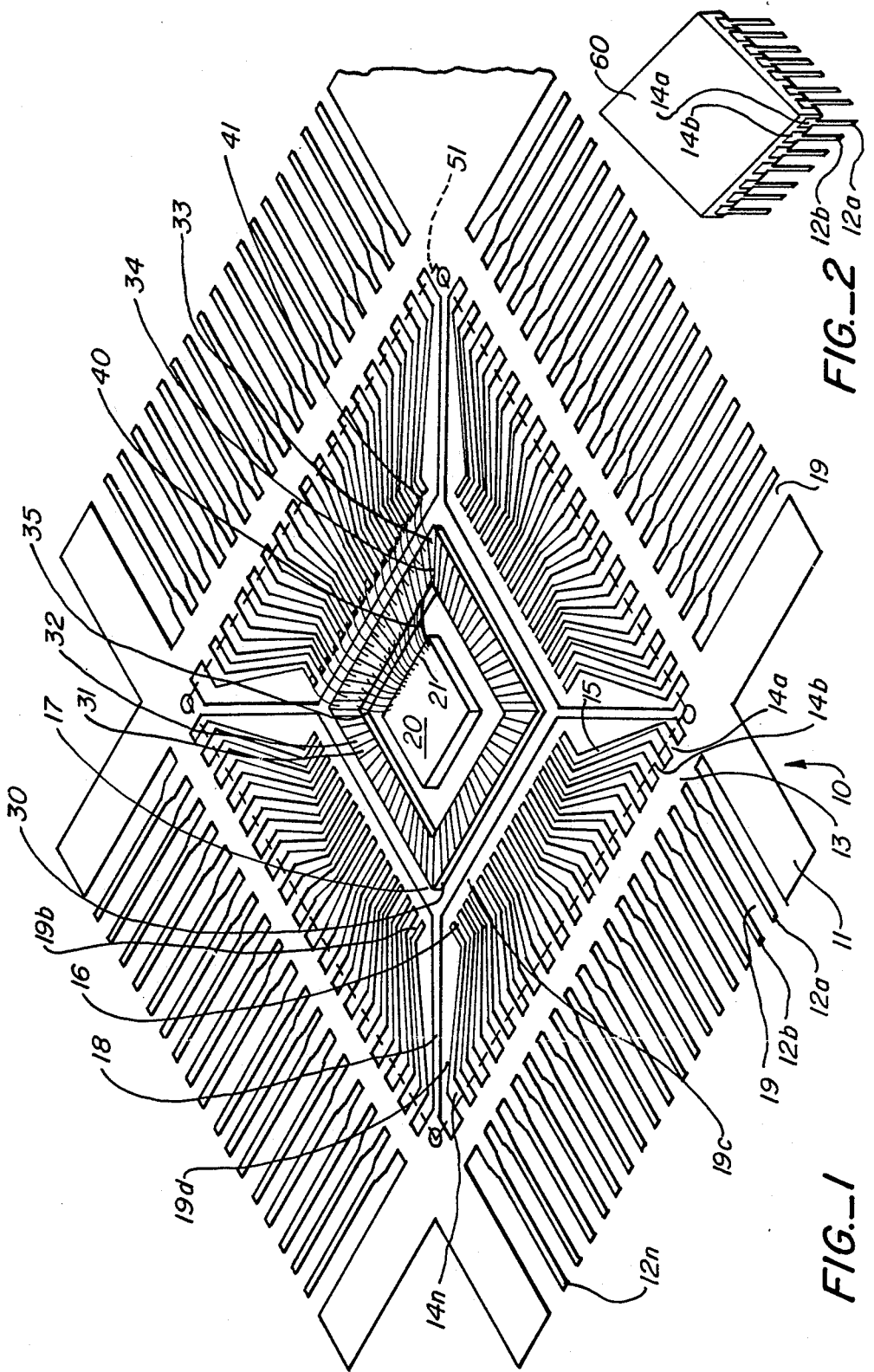

INTEGRATED CIRCUIT DIE-TO-LEAD FRAME INTERCONNECTION ASSEMBLY AND METHOD

BACKGROUND OF THE INVENTION

1. Field of the Invention

This invention relates to integrated circuit assemblies more particularly to an interconnecting assembly between integrated circuit package leads on a lead frame and the integrated circuit die.

2. Material Art

Interconnects between a semiconductive integrated circuit die and a metal lead frame have heretofore been made affixing a bonding wire between selected contact pads on the die and selected fingers of the lead frame. While originally this was a hand-operation, automatic wire bonding apparatus is conventionally used. There have been limitations in utilizing wire bonding when a high lead count of leads are required for connection with a centrally-mounted, increasingly smaller die with an increasingly larger number of die contact pads. To accommodate the centrally-mounted die and large number of die contacts the lead frame leads must be constricted in a converging pattern and even narrowed as they extend from the external portion of the leads to inner positions opposite the die contact pads. With an increasing number of leads in the lead frame and given a requirement for a minimum width of lead and a minimum spacing between the edges of adjacent leads, and the converging of the leads as they extend toward the die, the result is longer and longer wires extending from the lead frame leads to the die contact pads. For example, with 8 mil wide leads and 7–8 mil spacing between leads in a 68 or 84 leads lead frame the bond wire length between a convergent end of a lead to a die contact pad approaches about 150 mils. Such a length of the thin (outside diameter of 1.25 mil) gold wire can result in excess wire sag causing shorts between wires or result in wire "sweep" in which the thin long wire is swept away i.e. broken, during the subsequent package molding operations by flowing plastic encapsulant. In general, it has been found that the length of bonding wires should not exceed about 100 mils.

Improvements have been made by utilizing a so-called TAB (tape automated bonding) technique for connecting the die contact pads to the lead frame fingers. This technique is seen in U.S. Pat. Nos. 3,689,991 and 3,544,857 in which in the latter a tab of metallized polyimide is etched to form conducting pathways and the tab placed downward to bridge between die contact pads and the leads of a lead frame. The tab substitutes for the bonding wires. However, there are many other interconnect applications when it is desired to use bonding wires so as to not to incur the added expense and inconvenience of adding bonding bumps to the die and lead frame for proper bonding of the tab to the die and lead frames, respectively.

SUMMARY OF THE INVENTION

The present invention involves an intermediate insulative bridge generally in the form of an annular square having generally transverse plated pathways thereon which bridge is spacedly mounted between the outer periphery of a centrally-mounted die and the inner periphery of the tips or terminus of the leads of a conductive metal lead frame facing the die. Plating of the pathways on the bridge is not as restrictive dimension-wise as is the etching away of a metallized surface to leave metal pathways. For example, the plated pathways may be 7 mils wide with a 6 mil spacing between the edges of adjacent plated pathways. Thus more pathways may be placed transversely along a finite length of each side of the annular square to accommodate for example the 68 or 84 leads of a lead frame. After the bridge has been spacedly affixed around a central area of the lead frame mounting the die, two concentric series of bond wires are affixed to the bridge, one series extending from one end of the bridge pathways to the die contact pads and the other series extending from the outer end of the bridge pathways to the leads of the lead frame. The result is that each wire of the two series of bond wires are less than 100 mils in length being approximately of from about 60–80 mils in length in most applications. Each of the bonding wires are bonded to their respective contact pads, bridge pathways and leads by using conventional wire bonding apparatus.

In the method of the invention the annular bridge is formed by plating a thin polyimide substrate with metal pathways, normally by plating succeeding layers of copper, then nickel and then gold; the bridge is then affixed to a central pad of the lead frame by a suitable adhesive such as silver-filled epoxy; the die is mounted centrally of the annular opening of the bridge; a first series of bond wires are affixed between selected die contact pads and selected ones of the bridge pathways; and a second series of bond wires are affixed between ones of the bridge pathways to selected ones of the lead frame leads. The resultant assembly is encapsulated by molding an insulative package over the die, the bridge, the bond wires and an inner portion of the leads of the lead frame. Interconnections which hold the leads outside the mold line are sheared leaving the inner and outer leads of the lead frame integrally connected. The leads or pins extending from the completed package are then bent, if it is desired to have them form a quadmount package with extending contact pins.

BRIEF DESCRIPTION OF THE DRAWING

FIG. 1 is a perspective top view of the integrated circuit die-frame connection of the present invention.
FIG. 2 is a perspective view of a completed package incorporating the invention.

DETAILED DESCRIPTION

The invention is shown in FIG. 1 where a metal lead frame 10 of a typical thickness of 10 mils has a frame interconnect means 11 supporting a predetermined pattern of outer peripheral leads 12a, 12b, . . . 12n, where n represents the number of leads on each side of the lead frame which extend in sets of parallel leads on the peripheral sides of the lead frame. In the preferred embodiment the sets of leads extend from four sides of a generally square lead frame. Lead frame dam 13 interconnect leads 12a, 12b, etc., and as later described are eventually broken or sheared away to provide electrically discrete leads. Extending inwardly of leads 12a, 12b, etc., are a second predetermined pattern of inner leads 14a, 14b, . . . 14n, each of which have converging and narrowing intermediate portions 15 and parallel inner terminus leads 16. Each inner lead 14a, 14b, etc., is integral with a corresponding one of the outer leads 12a, 12b, etc.

Attached to frame means 11 are four integral tie-bars 18 extending to and supporting an integral central die-mounting surface 17. Each lead 12a, 12b, etc is separated by an open space 19 which is punched out or otherwise left open during the lead frame fabrication. Other open spaces 19a, 19b and 19c are provided on the sides of the tie-bars, the inner leads and around the central die-mounting surface, respectively.

An integrated circuit die 20, which may be in the form of any semiconductor device such as a transistor, microprocessor, diode and the like is affixed to the center of surface 17 by a suitable silver-filled epoxy adhesive, which serves to conduct heat from and to make any desired grounding or back side bias connection between the die and the lead frame. The die typically has a series of die contact pads 21 at its edges. Typically a 68 or 84 contact pads die is about 125 mils square with a die thickness of about 25 mils.

An insulative bridging member 30 having an annular square preferred configuration is also affixed by a silver-filled epoxy adhesive to the central die-mounting surface 17 so that it spacedly surrounds die 20 and is spaced inwardly of the terminus ends 16 of the inner leads of the lead frame. In a preferred embodiment the bridging member 30 is about 370 mils square with a central opening 35 of about 240 mils. The bridging member is typically made of 25 mil th:ck polyimide material. Spaced conductive plated pathways 31, 32, etc., are provided transverse of the bridging member. Pathways 31, 32, etc., converge and narrow as they progress inwardly. Typically the pathways are about 7-6 mils wide with a 6 mil spacing between adjacent pathways. Each pathway corresponds to and is generally aligned with a selective one of the inner leads of the lead frame. The pathways are plated on the polyimide foil and typically comprise a first layer of copper plate of 0.7 mil thickness, a second layer of nickel plate of 0.1 mil thickness to prevent bleed through of copper, and an outer layer of gold plate of 0.04 mil thickness. Planarity between ± about 4 mils is preferred. The bridging member may take the form of a series of bridging segments spacedly positioned opposite one, two or more sides of the die so that it substantially lessens the effective distance which a bonding wire must span, thus permitting use of relatively short bonding wires which do not detrimentally sag or are swept away by a subsequent encapsulation molding process.

The assembly of the interconnection itself is completed by affixing a first series of bond wires 40 extending between contact pads 21 and an inner end 34 of selected ones of the conductive pathways on the bridging member, and a second series of bond wires 41 extending between an outer end 33 of selected ones of the conductive pathways and the terminus ends 16 of the inner leads 14a, 14b, etc. Wire bonding is done by utilizing conventional wire bonding apparatus such as Model 1419 of K&S Co. of Horscham and Model UTC-10 of Shinkawa Inc. of Japan. Two generally concentric rows of wire bonds result from the wire bonding, the first series surrounding the die and the second series surrounding the bridging member. By the use of the described bridging member approximately spaced and sized as above, the length of the short bonding wires are less than 100 mils thus preventing detrimental wire sag or wire sweep.

An encapsulating package 60 as shown in FIG. 2 is molded within dash mold line 51 (FIG. 1) to form a resultant die package with the outer peripheral leads 12a, 12b, etc., extending from the package. The dam bars 13 of FIG. 1 have are shown as having been removed in FIG. 2 with an outer part of inner leads 14a, 14b, etc., extending from the encapsulant. Generally, a Novolac plastic encapsulant is employed.

The above description of the preferred embodiment of this invention is intended to be illustrative and not limiting. Other embodiments of this invention will be obvious to those skilled in the art in view of the above disclosure.

We claim:
1. An integrated circuit die-to-lead frame interconnection assembly comprising:
    a lead frame of conductive metallic material having
        a first predetermined pattern of outer peripheral leads,
        a second predetermined pattern of inner leads connected to said first predetermined pattern of outer peripheral leads and converging to inwardly spaced positions,
        frame means for interconnecting said outer peripheral leads and said inner leads, and
    a central die-mounting surface integral with and extending from said frame means and spacedly extending inwardly from an inner terminus of said inner leads;
    an integrated circuit die having die contact pads on an exterior surface, said die being mounted on said central die-mounting surface;
    an insulative bridging member mounted on said central die-mounting surface spacedly between said die and an inner terminus of said inner leads, said bridging member having a transverse series of spaced conductive pathways thereon;
    a first series of bonding wires connecting selected ones of said die contact pads to an inner end of selected ones of said conductive pathways;
    a second series of bonding wires connecting an outer end of said selected ones of said conductive pathways to selected ones of said inner leads; and
    further comprising an insulating package encapsulating said inner leads, said central die-monting surface, said die, said bridging member, and said first and second series of bonding wires, and wherein said frame means is separated between adjacent interconnections of said outer leads and said inner leads to form discrete outer leads extending from the package.
2. The interconnection assembly of claim 1 in which said first and second predetermined patterns each comprise sets of parallel leads extending from opposed sides of said lead frame.
3. The interconnection assembly of claim 1 in which said bridging member comprises an annular square of constant thickness peripherally extending in spaced relation around said integrated circuit die.
4. The interconnection assembly of claim 1 in which said conductive pathways on said bridging member are plated metal extending across a planar top surface of said bridging member from an inner edge to an outer edge of said bridging member.
5. The interconnection assembly of claim 1 in which said bridging member is spaced less than 100 mils from said die and less than 100 mils from said inner leads.
6. The interconnection assembly of claim 1 in which each bonding wire of said first and second series of bonding wires are less than 100 mils in length.
7. The interconnection assembly of claim 1 in which said transverse series of spaced conductive pathways on said bridging member converge from an outer periphery of said bridging member to an inner periphery of said bridging member.
8. The interconnection assembly of claim 1 further including a plurality of spaced tie bars extending integrally between said frame means and said central die-mounting surface.

* * * * *